United States Patent
Mann et al.

(10) Patent No.: US 8,393,163 B2
(45) Date of Patent: Mar. 12, 2013

(54) SUSPENSION ROD TENSIONING ARRANGEMENTS FOR SUPPORTING CRYOGENIC EQUIPMENT WITHIN A CRYOSTAT

(75) Inventors: Nicholas Mann, Berkshire (GB); Jennifer Ridley, Halesworth (GB)

(73) Assignee: Siemens Plc, Frimley, Camberley (GB)

( * ) Notice: Subject to any disclaimer, the term of this patent is extended or adjusted under 35 U.S.C. 154(b) by 938 days.

(21) Appl. No.: 12/129,814

(22) Filed: May 30, 2008

(65) Prior Publication Data
US 2008/0295528 A1 Dec. 4, 2008

(30) Foreign Application Priority Data

May 30, 2007 (GB) .................................. 0710216.3

(51) Int. Cl.
*F25B 19/00* (2006.01)
*F16B 7/08* (2006.01)
*F16B 9/00* (2006.01)
*B65D 51/16* (2006.01)
*A47H 1/10* (2006.01)

(52) U.S. Cl. ...... 62/51.1; 403/167; 403/168; 220/560.1; 248/317

(58) Field of Classification Search .................. 62/51.1; 403/167, 168; 220/560.1
See application file for complete search history.

(56) References Cited

U.S. PATENT DOCUMENTS

| | | | |
|---|---|---|---|
| 2,859,056 A | 11/1958 | Marks | |
| 3,327,380 A * | 6/1967 | Howlett | 29/452 |
| 3,534,989 A | 10/1970 | Yonkers | |
| 4,124,321 A * | 11/1978 | Hutchins | 403/167 |
| 4,492,090 A * | 1/1985 | Laskaris | 62/50.7 |
| 4,516,405 A * | 5/1985 | Laskaris | 62/50.7 |
| 5,083,105 A * | 1/1992 | Herd et al. | 335/216 |
| 5,140,823 A * | 8/1992 | Mraz | 62/51.1 |
| 5,537,829 A | 7/1996 | Jones et al. | |
| 5,864,273 A * | 1/1999 | Dean et al. | 335/216 |
| 6,230,502 B1 * | 5/2001 | Kershaw | 62/51.1 |

FOREIGN PATENT DOCUMENTS

| | | |
|---|---|---|
| GB | 881774 | 11/1961 |
| JP | 1141213 | 6/1989 |

* cited by examiner

*Primary Examiner* — Frantz Jules
*Assistant Examiner* — Keith Raymond
(74) *Attorney, Agent, or Firm* — Schiff Hardin LLP

(57) ABSTRACT

A cryostat, comprising an outer vacuum vessel containing cryogenic equipment suspended from the outer vacuum vessel by a number of suspension rods. At least one of the suspension rods is provided with a tensioning and retaining mechanism for holding that suspension rod in tension braced against a suspension bracket). This tensioning and retaining mechanism includes a tubular rod carrier arranged, in use, to pass through a hole or slot in the suspension bracket, the rod carrier having an axial bore through which, in use, the rod may pass; a thread on its outer surface along at least part of its length; and a rod bearing surface for, in use, transmitting force to the rod. This tensioning and retaining mechanism also comprises a tensioning nut threaded onto the thread so as to, in use, brace against the suspension bracket to urge the tubular rod carrier in the direction of the rod bearing surface so as to apply tension to the rod.

4 Claims, 4 Drawing Sheets

SUSPENSION ROD TENSIONING ARRANGEMENTS FOR SUPPORTING CRYOGENIC EQUIPMENT WITHIN A CRYOSTAT

BACKGROUND OF THE INVENTION

1. Field of the Invention

The present invention concerns a suspension rod tensioning arrangement of the type used to support cryogenic equipment within a cryostat.

2. Description of the Prior Art

In order to improve access for clinicians and improve patient comfort, it is advantageous to make magnets used in MRI systems as compact as possible. The superconducting magnet typically used must be held at cryogenic temperatures, and this requires that superconducting magnets must be suspended by a suspension system, and heat conduction through the suspension system must be minimized.

Magnetic resonance imaging (MRI) systems typically include a cryogenically cooled superconducting magnet, retained within a cryostat, essentially comprising an evacuated outer vacuum vessel. Suspension arrangements are typically provided, and comprise a number of support rods or bands or similar. The suspension arrangements are designed to have very high tensile strength, to withstand both the static load of the weight of the magnet and its cooling arrangements, and dynamic loads resulting from operation of the MRI system, or transportation of the magnet in the cryostat.

Suspension rods of high strength metal such as austenitic stainless steel are an established way of supporting cryogenically cooled superconducting magnets within cryostats. FIG. 5 schematically illustrates a conventional support arrangement for a cryogenically cooled magnet within a cryostat. Feature 52 represents a superconducting magnet with its cooling arrangement. As is conventional, this may include a number of coils mounted on a former housed within a cryogen vessel partially filled with liquid helium. However, other cooling arrangements may be provided and the present invention is not limited by the particular cooling arrangement chosen. The magnet and cooling arrangement, 52, is housed within an outer vacuum vessel 54. This provides thermal isolation from ambient temperature. Other features such as thermal radiation shields may be provided, as is known to those skilled in the art, but are not shown in FIG. 5 for clarity. The magnet and cooling arrangement 52 is retained by a number of support rods 10. As illustrated in the drawing, it is conventional to try to have these rods as long as possible, so as to increase their thermal resistance and so reduce the thermal influx through the material of the support rods 10 to the magnet and cooling arrangement 52. Support brackets are provided on the magnet and cooling arrangement 52 and the outer vacuum vessel 54. The support rods 10 are tensioned between the brackets to bear the static and dynamic loads caused by the magnet and cooling arrangement 52. The notion of thermal length represents the distance through which conducted heat has to travel from the outer vacuum vessel 54 to reach the magnet and cooling arrangement 52. The cross-section and thermal conductivity of parts of the heat path may also be taken into account when considering the thermal length. Thus, while principally concerned with length, the concept of thermal length represents thermal resistance between two objects.

In conventional designs thermal load is minimized by the use of long rods, typically with threaded ends to facilitate assembly and tensioning. However, these designs result in relatively large cryostats to provide space for assembly and suspension rod termination systems. In order to reduce the required length, high strength materials with lower conductivity than metals may be used, for example glass or carbon fiber composites, but these are inherently expensive to manufacture.

SUMMARY OF THE INVENTION

While the present invention is described with particular reference to the support of a cryogenically cooled magnet, it is applicable to the support of any cryogenic equipment; this is to say equipment cooled to temperatures significantly below ambient, housed within an outer vacuum vessel 54.

An object of the present invention is to provide a cryostat containing cryogenic equipment suspended by an arrangement that provides low heat load within a compact cryostat without the use of expensive materials. The invention achieves the above object by further increasing the thermal length of the suspension rods.

Compact suspension arrangements utilizing composite bands and facilitating easy ("hook-on") assembly are described in United Kingdom patent application GB2426545 of Siemens Magnet Technology Ltd. The present invention addresses a similar problem and provides lower cost, typically metal, rod suspension.

Known metal suspension rods as used to support superconducting magnets for MRI imaging equipment have long been restrained using a threaded end with a co-operating nut. However, to achieve acceptable fatigue strength the threads must be manufactured to a high standard. In addition, to minimize thermal load, the diameter of the non-threaded part of the rods should be reduced below the diameter required for thread forming, which is costly in manufacture. Features such as flats may be provided on the rod to prevent rotation during tensioning of the nut; these are expensive to manufacture and difficult to use, for example several spanners may be required simultaneously in order to tension nuts on a suspension rod.

Alternative arrangements for terminating rods are known, for example using cold-formed heads to overcome the disadvantages of threads, and are used, for example, in the field of marine rigging. However, this does not inherently provide a method of length adjustment, and the known provisions to achieve length adjustment are bulky and compromise thermal length in a support arrangement for cryogenically cooled equipment.

FIG. 3 shows a known arrangement using threaded fasteners, typical of the suspension arrangements in use in MRI magnet systems. Use of such threaded fasteners limits fatigue life of the support system and does not optimize the thermal length.

Rod 10 has a widened, threaded portion 38 which passes through a hole or slot in outer suspension bracket 32. A washer 40 is placed over the threaded portion to abut an outer surface of the outer suspension bracket 32. In order to eliminate bending loads in the rod, this single washer may be replaced by a pair of washers with complimentary male and female spherical contacting surfaces thus providing angular movement. A tensioning nut 22 is threaded onto the threaded portion 38 of the rod, and is tightened to apply the required tension to the rod 10. A locking nut 24 is preferably added, tightened onto the tensioning nut 22 to prevent loosening of the tensioning nut 22. The end of the rod may be provided with a slotted head 14 or equivalent, so that the rod may be held by a suitable tool, so as to prevent of rotation of the rod while the nuts 22, 24 are tightened.

The present invention aims to provide an improved rod suspension arrangement for supporting cryogenic equipment within an outer vacuum vessel, in which a thermal length is maximized; the threading of the rod is avoided, so avoiding the need for different rod thicknesses at different positions on the rod, and minimizing required rod thickness over the main length; the operation of applying preload tension to the support rod is simplified; angular misalignment of the rod is allowed for; and fatigue life is optimized by avoiding deformation or thinning of the rod.

The above object is achieved in accordance with the present invention by a cryostat that has an outer vacuum vessel containing cryogenic equipment suspended from the outer vacuum vessel by a number of suspension rods, wherein at least one of the suspension rods is provided with a tensioning and retaining mechanism that holds that suspension rod in tension, braced against a suspension bracket, and wherein the tensioning and retaining mechanism includes a tubular rod carrier that is arranged, in use, to pass through a hole or slot in the suspension bracket. This rod carrier has an axial bore through which, in use, the rod passes, a thread on a outer surface of the rod carrier along at least a part of the its length, and a rod bearing surface for, in use, transmitting force to the rod. A tensioning nut is threaded onto the thread that, in use, braces against the suspension bracket so as to urge the tubular rod carrier in the direction of the rod bearing surface, in order to apply tension to the rod.

DESCRIPTION OF THE PREFERRED EMBODIMENTS

The tension rod support arrangement according to a feature of the present invention provides at least some of the following features: Structure is provided for achieving a consistent application of preload. Angular misalignment of the rod must be tolerated within a defined range. The capability exists to accommodate variations in the actual and required length of the rod. The thermal length of the rods is to be maximized between the supported article, such as a superconducting magnet, and a support surface. A locking arrangement is provided to prevent loosening of the suspension rod, and so to maintain an applied preload. The arrangement can be produced by an assembly process that allows the tensioning end of the rod to be fitted after location of the opposite end of the rod. The arrangement has an optimized fatigue life. Twisting of the suspension rod during length adjustment is prevented.

Figure 2:
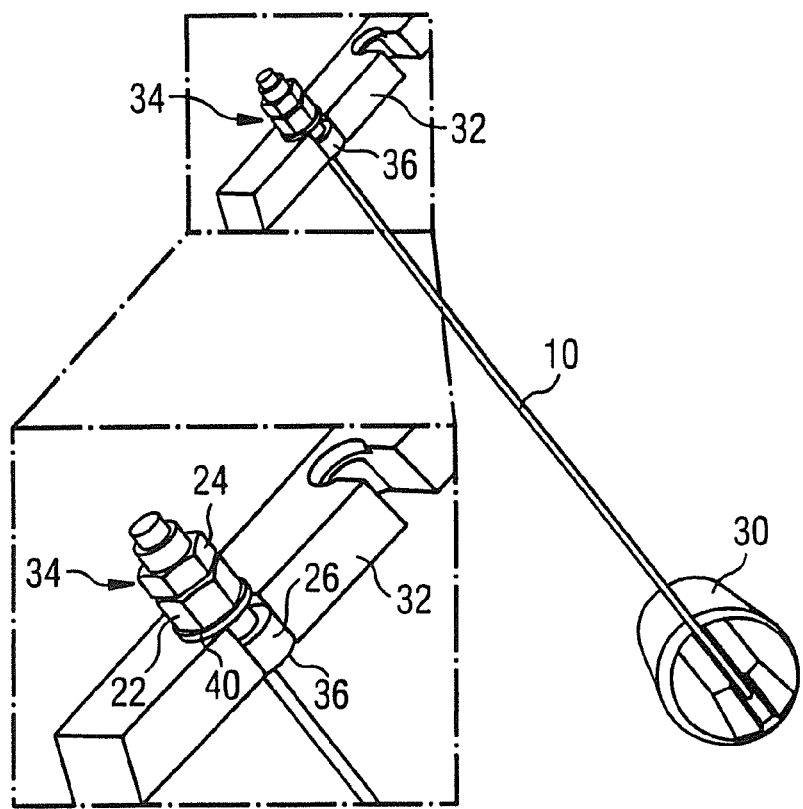
FIG. 2 illustrates a complete suspension rod assembly according to an embodiment of the present invention.

FIG. 2 shows an entire suspension unit according to an embodiment of the present invention, including the inner end suspension bracket on to which the rod preferably hooks. Typically, at least eight such suspension units would be employed within a single cryostat to provide support of the suspended cryogenic equipment in all degrees of freedom. A suspension rod assembly is shown, in which a suspension rod 10 is provided, between the outer vacuum vessel and the suspended cryogenic equipment. The suspended cryogenic equipment is provided with an "inner end suspension bracket" 30, while the outer vacuum vessel is provided with an "outer end suspension bracket" 32. The terms such as "outer" and "inner" are used herein as convenient labels, rather than limiting the invention in any way. In particular, the adjustment mechanism described below may be located adjacent either the inner end suspension bracket 30 or the outer end suspension bracket 32. The suspension brackets 30, 32 may take any convenient form and need not resemble those illustrated.

The suspension rod 10 preferably attaches to the inner end suspension bracket 30 by a hook-on process, such that it is simple to hook the "inner" end of rod 10 with a suitable end arrangement onto a co-operating feature of the inner end bracket, by moving the rod at the "outer" end, without needing direct access to the inner end suspension bracket. Such an arrangement has been found to facilitate assembly as access to the inner end bracket is often difficult. A more complete description of the features of rod 10 and inner end bracket 30 which allow such hook-on operation follows.

Figure 4A:
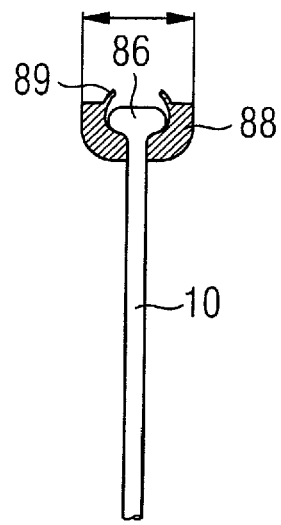
FIGS. 4A-4C show a hook-on arrangement, suitable for attaching an inner end of a suspension rod to an inner end suspension bracket.
Figure 4B:
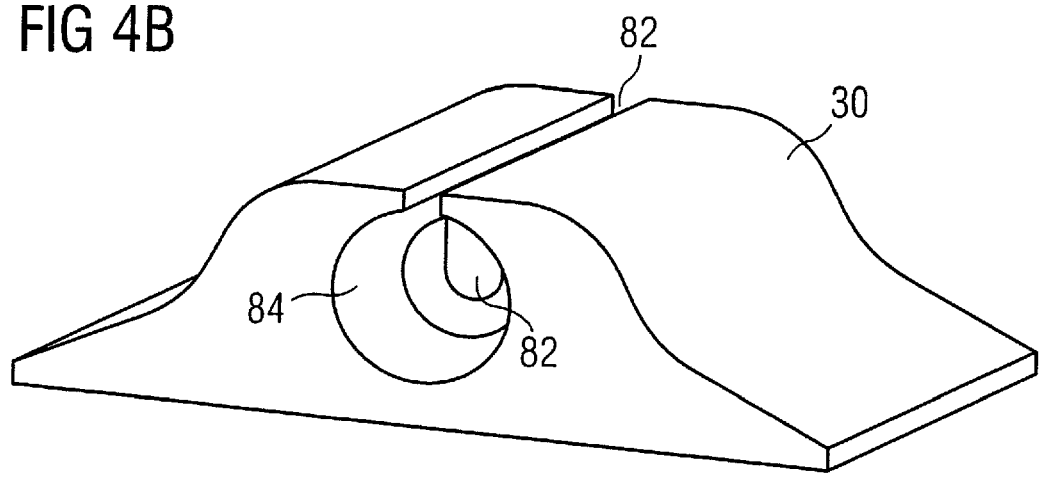
Figure 4C:
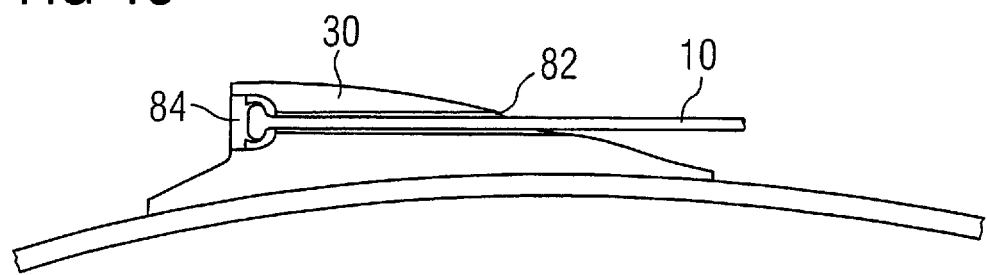

FIGS. 4A, 4B and 4C illustrate a hook-on arrangement which may be used to attach an inner end of suspension rod 10 to an inner end suspension bracket 30. Other arrangements may of course be used, but such hook-on arrangements are considered as useful in combination with the tensioning and retaining arrangement featured in the present invention so as to provide a simple, easily-adjustable suspension arrangement. For ease of description, FIGS. 4A, 4B, 4C will be described together.

A particular form of inner end suspension bracket 30 is illustrated. It includes a slot 82 of sufficient width to allow the body of rod 10 to pass into the slot. At an inner end of the slot, a cavity 84 is formed. The rod 10 is provided with an enlarged head 86 at its inner end, by any suitable method such as by mechanical upsetting. A retaining piece 88 is provided, having a through hole through which the body of the rod 10 passes, and a receiving cavity which accommodates and preferably also retains the enlarged head 86 of the rod. Features 89 such as a swaged feature may be provided for holding the retaining piece and the enlarged head together. Alternatively, the rod and the retaining piece may be held together by a circlip. The cavity 84 in the inner end suspension bracket 30 is dimensioned to accommodate the retaining piece 88 and the enlarged head 86. During assembly of the suspension arrangement, retaining piece 88 is placed over the enlarged head. This may be done by threading the retaining piece onto the rod from the other end, or by threading the retaining piece onto the rod before formation of the enlarged head, or by assembling a retaining piece 88, from two or more pieces, around the body of the rod 10. The body of rod 10 is passed into slot 82, ensuring that the retaining piece 88 protrudes beyond the inner end of the bracket 30. The rod is then pulled in the outward direction, to cause the retaining piece 88 to enter the cavity 84, as shown in FIG. 4C. The contacting surfaces of the cavity 84 and the retaining piece 88 are preferably approximately spherical, to allow some degree of alignment adjustment between the rod and the bracket. If misalignment is not present, it may be found that the retaining piece 88 may be dispensed with, the rod being retained within cavity 84 directly upon its enlarged head 86.

Referring again to FIG. 2, it can be seen that the rod 10 passes through outer end suspension bracket 32, and is tensioned by a mechanism 34 which will be described in more detail with reference to FIG. 1. Of particular interest with reference to the outer end suspension bracket is the provision of slot 36, into which the rod 10 and mechanism 34 may be brought. The use of such a slot 36 means that the rod 10 and mechanism assembly 34 do not need to be disassembled during attachment and tensioning.

The overall method for fitting and tensioning a rod suspension assembly according to the invention and as illustrated in FIG. 2 is preferably:
the inner end is hooked on the inner end suspension bracket 30;
the outer end and the mechanism 34 are swung into the slot 36 of the outer end suspension bracket 32; and
pre-tension is applied to the rod by operation of the mechanism 34, as discussed below with reference to FIG. 1.

Figure 5:
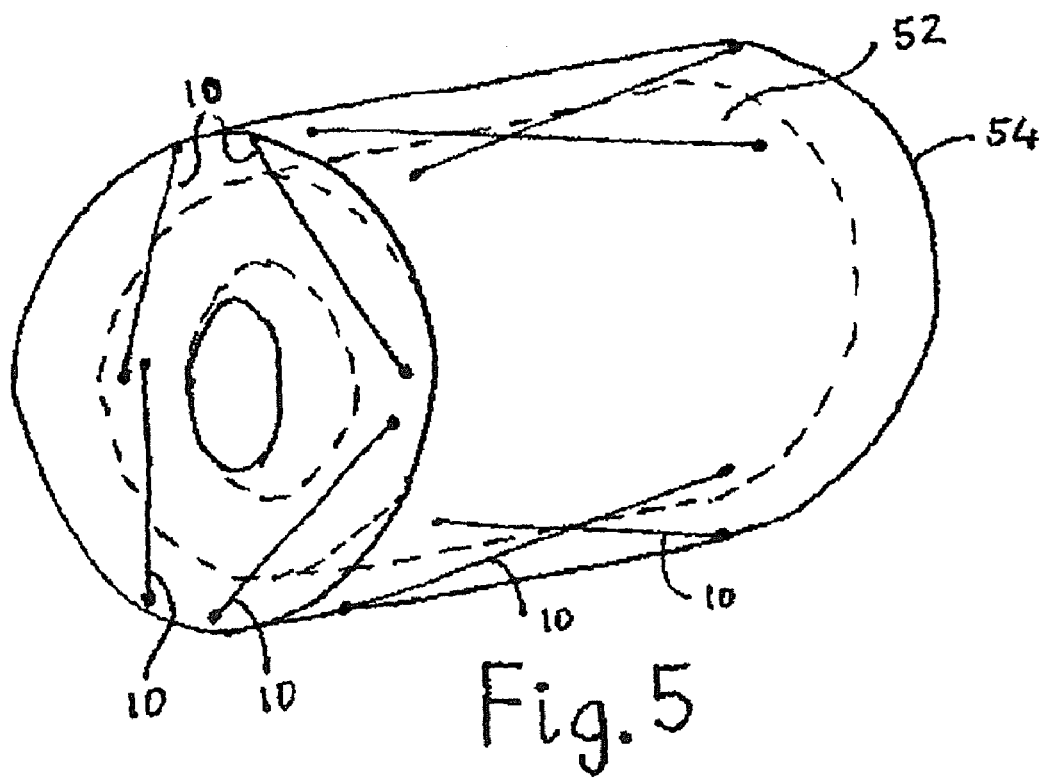
FIG. 5 schematically illustrates a conventional support arrangement for a cryogenically cooled magnet within a cryostat.

The inner end suspension bracket 30 of FIGS. 4A-4C is arranged such that the rod 10 joins the bracket substantially parallel to the surface of the cryogenic equipment to which it is attached. This is typically the case for the support of cooled magnets such as illustrated in FIG. 5 and will typically result from designs intended to maximize the length of the support rods. Of course, similar inner end suspension brackets may be conceived by those skilled in the art to hold the rod 10 at other angles to the surface of the cryogenic equipment to which it is attached FIG. 1 illustrates a cross-section of the tensioning and retaining mechanism 34 of an embodiment of the present invention.

Figure 1:
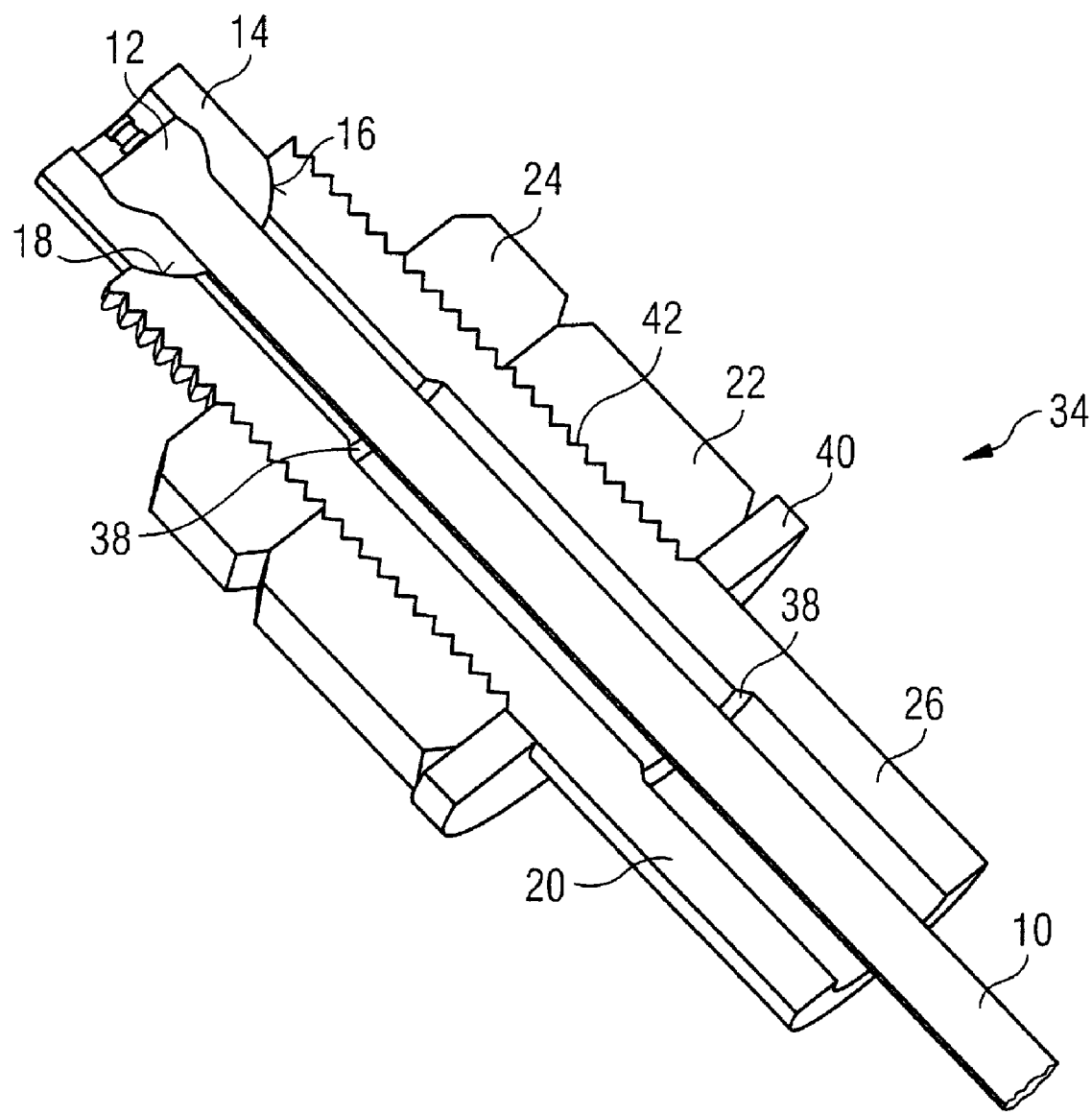
FIG. 1 illustrates a rod mounting and tensioning assembly according to an aspect of the present invention.

FIG. 1 shows the outer end of rod 10 and the tensioning and retaining mechanism 34. The rod 10 passes through a tubular rod carrier 20 and is retained against a surface of the rod carrier by a rod end piece 14. The end of rod 10 is formed into an enlarged head 12, preferably by an upsetting operation. Tension will be applied to the rod through this enlarged head, so avoiding the stress concentration of the former threaded rods. The rod end piece 14 has a through-hole through which the rod 10 passes, and an inner retaining cavity to retain the enlarged head 12 of the rod 10. The inner retaining cavity preferably conforms closely to the shape of the enlarged head 12, so providing an effective mechanical contact over a relatively large surface area, increasing the fatigue life of the rod. The rod end piece 14 is provided with a spherical surface 16 abutting a complementary seat 18 on the end of the rod carrier 20. The arrangement of spherical surface 16 abutting complementary seat 18 allows operation of the tensioning and retaining mechanism 34 despite misalignment of respective axes of the rod 10 and the rod carrier 20 within a predetermined range of acceptable angular misalignment, for example ±2° in any direction. The bore of the rod carrier 20 is preferably tapered, either in the form of a truncated conical bore, or a bore having a number of differing diameters in a step arrangement 38 as illustrated in FIG. 1, to allow clearance to the rod 10 over the predetermined range of acceptable angular misalignment.

The rod carrier 20 is arranged to locate within the slot 36 of the outer end suspension bracket 32 (FIG. 2). Preferably, the rod carrier 20 has a shaped inner end 26, for example having opposed flat surfaces, which contact sides of the slot 36 and prevent rotation of the rod carrier 20. The rod carrier is threaded 42 on its outer surface along at least part of its length between the rod end piece 14 and the shaped inner end 26. A tensioning nut 22 is provided, threaded onto the thread 42 of the rod carrier 20. A washer 40 is preferably provided, over the rod carrier 20 to contact the surface of the outer end suspension bracket 32. As is conventional in itself, the washer provides a suitable bearing surface for tensioning nut 22.

The tensioning nut 22 provides tensioning of the suspension rod over the length of the thread 42, for example 20 mm, to allow adjustment to compensate for manufacturing tolerances of the components, and to allow pre-tensioning of the suspension rod. As the rod carrier is prevented from rotating by interaction of the shaped inner end 26 and the slot in the outer end suspension bracket, tensioning of the suspension rod 10 may simply be achieved by the use of a single spanner on tensioning nut 22.

A locking nut 24 is preferably provided, and is tightened onto tensioning nut 22 once the required tension has been established in the rod 10. This locking nut 24 prevents tensioning nut 22 from loosening after assembly. The tensioning nut 22 and the locking nut 24 may be assembled by passing over the rod end piece 14. The shaped inner end 26 may preclude nuts from being attached over that end.

Assembly of the tensioning and retaining mechanism 34 to the rod 10 may proceed by any one of numerous routes. For example, rod end piece 14 may be placed on the enlarged head 12 of the rod 10, with the nuts 22 and 24 being threaded onto rod carrier 20, which is then slid onto the other end of the rod 10. Alternatively, the rod carrier 20 with its nuts 22, 24 may be slid over the enlarged head 12 of the rod, with the rod end piece 14 being a two-part assembly, later positioned around the enlarged head.

Figure 3:
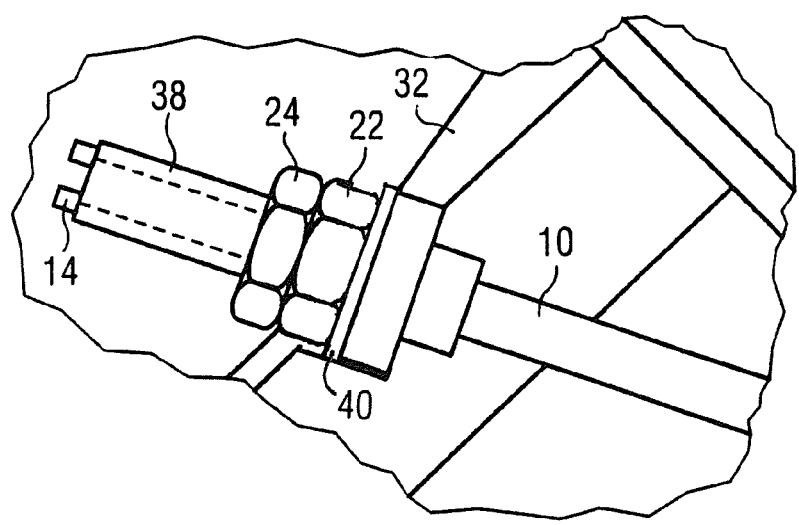
FIG. 3 illustrates known arrangements which use threaded fasteners.

Particular advantages of the suspension assembly of the present invention include the following. The rod 10 is restrained near its end 12, beyond the tensioning nut 22 and the outer end suspension bracket 32. This lengthens the thermal path between the inner end of the suspension rod and the outer end suspension bracket, as compared to former arrangements such as that illustrated in FIG. 3 in which the rod was threaded and passed through a tensioning nut at the outer end suspension bracket. Tensioning of the rod is simplified to a single-spanner operation, by providing a shaped inner end 26 of the rod carrier, which prevents rotation of the rod carrier within the outer end suspension bracket. The suspension rod 10 with tensioning and retaining mechanism 34 is found to be both compact and relatively low cost. Compactness is particularly advantageous in applications such as cryostats accommodating MRI magnets, since it is a common aim in the MRI industry to reduce the size of cryostats required to contain a magnet of given size while increasing thermal length of the suspension rods. By using a compact suspension arrangement such as provided by the present invention, the thermal length of the suspension rod may be increased, and the space required within the cryostat for the suspension arrangement may be reduced.

The present invention accordingly has a cryostat, with an outer vacuum vessel containing cryogenic equipment suspended from the outer vacuum vessel by a rod suspension arrangement. In certain embodiments, the rod suspension arrangement includes a tensioning and retaining mechanism enabling simple installation, by hooking an inner end into an inner end suspension bracket, slotting the tensioning and retaining mechanism into a slot 26 in the outer end suspension bracket and tightening the tensioning and lock nuts 22, 24 to apply a preload to the suspension rod 10.

While it is considered advantageous for each rod of the suspension arrangement to be provided with a tensioning and retaining mechanism 34 as provided by the present invention, it may be found advantageous in certain circumstances to provide some rods with other tensioning arrangements. The present invention accordingly extends to any cryostat, of the type having an outer vacuum vessel containing cryogenic equipment suspended from the outer vacuum vessel by a number of suspension rods, in which at least one of the suspension rods is provided with a tensioning and retaining mechanism as described.

The present invention accordingly provides a compact, low cost, low thermal load suspension system for a cryogenic equipment within a cryostat, for example a superconducting magnet used in an MRI system. Key features include suspension rods with headed ends in place of threads, and a tensioning and retaining mechanism that maximizes thermal length and facilitates easy assembly and tensioning during manufacture.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a cryostat, comprising an outer vacuum vessel containing cryogenic equipment suspended from the outer vacuum vessel by a number of suspension rods, at least one of the suspension rods being provided with a tensioning and retaining mechanism for holding that suspension rod in tension braced against a suspension bracket, the improvement of said tensioning and retaining mechanism comprising:

a tubular rod carrier having a first rod end configured to pass through a hole or slot in the suspension bracket, and having a second rod end opposite said first rod end, the rod carrier having an axial bore proceeding along a length of the rod carrier through which said at least one of the suspension rods passes, a thread on an outer surface of the rod carrier occupying at least part of said length, and a rod bearing surface that transmits force to said at least one of the suspension rods via a point of contact with said tubular rod carrier, said point of contact being between said first and second rod ends;

a tensioning nut threaded onto the thread configured to brace against the suspension bracket and thereby urge the tubular rod carrier in the direction of the rod bearing surface in order to apply tension to said at least one of the suspension rods dependent on a degree of threading of said tensioning nut on said thread along said at least part of said length occupied by said thread;

said tensioning nut being located relative to said point of contact to place said point of contact farther from said first rod end than said bearing surface;

a rod end piece having a through-hole through which said at least one of the suspension rods passes, and an inner retaining cavity configured to accommodate an end of said at least one of the suspension rods, said rod end piece having a spherical end piece bearing surface configured to bear upon the rod bearing surface of the tubular rod carrier, said rod bearing surface of said rod carrier being complementary to said spherical end piece bearing surface; and said axial bore of the rod carrier being tapered to allow clearance for said at least one of the suspension rods over a predetermined range of acceptable angular misalignment.

2. A cryostat according to claim 1, wherein the tensioning and retaining mechanism further comprises a locking nut threaded onto the thread at a position between the tensioning nut and the rod bearing surface.

3. A cryostat according to claim 1, wherein the tensioning and retaining mechanism further comprises a washer positioned between the tensioning nut and suspension bracket.

4. A cryostat according to claim 1, wherein the rod carrier has a shaped inner end that contacts sides of a slot in the suspension bracket and prevents rotation of the rod carrier.

* * * * *